United States Patent
Lin et al.

(10) Patent No.: US 10,658,221 B2
(45) Date of Patent: May 19, 2020

(54) SEMICONDUCTOR WAFER CLEANING APPARATUS AND METHOD FOR CLEANING SEMICONDUCTOR WAFER

(71) Applicant: Taiwan Semiconductor Manufacturing Co., Ltd., Hsinchu (TW)

(72) Inventors: Wang-Hua Lin, Xiushui Township, Changhua County (TW); Chun-Liang Tai, Hsinchu (TW); Chun-Hsiang Fan, Hsinchu (TW); Ming-Hsi Yeh, Hsinchu (TW); Kuo-Bin Huang, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/812,112

(22) Filed: Nov. 14, 2017

(65) Prior Publication Data

US 2019/0148212 A1    May 16, 2019

(51) Int. Cl.
| | |
|---|---|
| *H01L 21/687* | (2006.01) |
| *H01L 21/67* | (2006.01) |
| *B08B 3/08* | (2006.01) |
| *B08B 3/10* | (2006.01) |

(52) U.S. Cl.
CPC .......... *H01L 21/68721* (2013.01); *B08B 3/08* (2013.01); *B08B 3/10* (2013.01); *H01L 21/67051* (2013.01); *H01L 21/67103* (2013.01); *H01L 21/68728* (2013.01); *H01L 21/68735* (2013.01); *H01L 21/68742* (2013.01)

(58) Field of Classification Search
CPC ......... H01L 21/68721; H01L 21/68728; H01L 21/68735; H01L 21/68707; H01L 21/68785; H01L 21/68764; H01L 21/68771; B08B 3/04; B08B 11/02; B08B 1/04
USPC .... 134/44, 1.2, 1.3, 22.11, 85, 92, 135, 137; 118/503, 728
See application file for complete search history.

(56) References Cited

U.S. PATENT DOCUMENTS

| | | | | |
|---|---|---|---|---|
| 5,431,421 A | * | 7/1995 | Thompson | ........ H01L 21/67023 118/503 |
| 5,989,342 A | * | 11/1999 | Ikeda | ...................... B05C 11/08 118/52 |
| 9,343,287 B2 | * | 5/2016 | Nakano | .................... H01L 21/00 |
| 2002/0153676 A1 | * | 10/2002 | Noguchi | ........... H01L 21/67288 279/106 |

(Continued)

*Primary Examiner* — David G Cormier
*Assistant Examiner* — Thomas Bucci
(74) *Attorney, Agent, or Firm* — McClure, Qualey & Rodack, LLP

(57) ABSTRACT

A method for cleaning a semiconductor wafer is provided. The method includes placing a semiconductor wafer over a supporter arranged around a central axis of a spin base. The method further includes securing the semiconductor wafer using a clamping member positioned on the supporter. The movement of the semiconductor wafer during the placement of the semiconductor wafer over the supporter is guided by a guiding member located over the clamping member. The method also includes spinning the semiconductor wafer by rotating the spin base about the central axis. In addition, the method includes dispensing a processing liquid over the semiconductor wafer.

20 Claims, 13 Drawing Sheets

(56) References Cited

U.S. PATENT DOCUMENTS

| | | | |
|---|---|---|---|
| 2004/0159343 A1* | 8/2004 | Shimbara | G11B 23/505 134/33 |
| 2004/0195785 A1* | 10/2004 | Jan | H01L 21/68728 279/106 |
| 2006/0027323 A1* | 2/2006 | Miya | H01L 21/68728 156/345.23 |
| 2006/0054082 A1* | 3/2006 | Okuno | H01L 21/68728 118/50 |
| 2008/0061519 A1* | 3/2008 | Cho | B23B 31/1269 279/106 |
| 2008/0127888 A1* | 6/2008 | Kim | H01L 21/68728 118/52 |
| 2008/0189975 A1* | 8/2008 | Miya | H01L 21/68728 34/317 |
| 2011/0148022 A1* | 6/2011 | Brugger | H01L 21/68757 269/296 |
| 2013/0154203 A1* | 6/2013 | Tschinderle | H01L 21/68728 279/33 |
| 2013/0214497 A1* | 8/2013 | Yoshida | H01L 21/68728 279/131 |
| 2014/0261162 A1* | 9/2014 | Yamaguchi | H01L 21/6715 118/52 |
| 2014/0299166 A1* | 10/2014 | Furuya | H01L 21/68728 134/153 |
| 2015/0008632 A1* | 1/2015 | Gleissner | H01L 21/68721 269/225 |
| 2015/0083038 A1* | 3/2015 | Furuya | G03F 7/3021 118/53 |
| 2015/0200123 A1* | 7/2015 | Brugger | H01L 21/68728 219/444.1 |
| 2015/0243542 A1* | 8/2015 | Yoshihara | H01L 21/6708 156/345.15 |
| 2015/0270146 A1* | 9/2015 | Yoshihara | H01L 21/67028 134/18 |
| 2015/0279708 A1* | 10/2015 | Kobayashi | C23C 16/458 438/747 |
| 2016/0096205 A1* | 4/2016 | Kato | H01L 21/67046 134/21 |
| 2016/0148827 A1* | 5/2016 | Wakiyama | H01L 21/68728 118/503 |
| 2016/0214148 A1* | 7/2016 | Okutani | H01L 21/02057 |
| 2016/0279678 A1* | 9/2016 | Yoshitomi | H01L 21/67051 |
| 2016/0284585 A1* | 9/2016 | Kobayashi | H01L 21/67742 |
| 2017/0004993 A1* | 1/2017 | Tanaka | H01L 21/31111 |
| 2017/0056936 A1* | 3/2017 | Nishiyama | H01L 21/67051 |
| 2017/0221696 A1* | 8/2017 | Nishiyama | B08B 1/002 |
| 2017/0282210 A1* | 10/2017 | Okutani | B05B 3/02 |
| 2017/0287769 A1* | 10/2017 | Ota | H01L 21/67028 |
| 2017/0345684 A1* | 11/2017 | Hohenwarter | H01L 21/6875 |
| 2017/0358480 A1* | 12/2017 | Zhang | H01L 21/68721 |

* cited by examiner

SEMICONDUCTOR WAFER CLEANING APPARATUS AND METHOD FOR CLEANING SEMICONDUCTOR WAFER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with a series of wafer fabrication tools (i.e., "processing tools"). Each processing tool typically performs a single wafer fabrication task on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing). Although existing processing tools have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
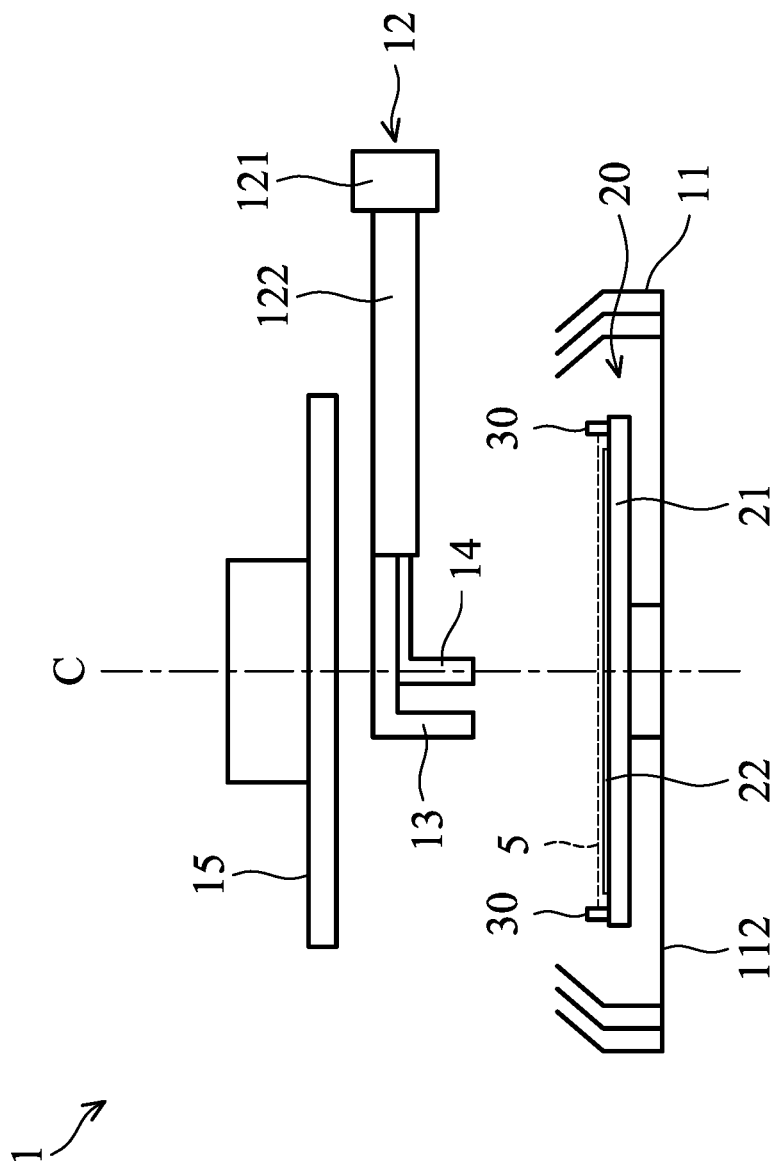
FIG. 1 is a schematic diagram of a cleaning apparatus in semiconductor fabrication, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic view of a cleaning apparatus 1, in accordance with some embodiments. The cleaning apparatus 1 is configured to clean one or more semiconductor wafers 5. The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the cleaning apparatus 1 includes a catch cup 11, a transferring module 12, a number of supply units, such as first supply unit 13 and second supply unit 14, a shield plate 15, a spin chuck 20 and a number of chuck pins 30. It should be appreciated that additional features can be added to the cleaning apparatus 1, and some of the features described below can be replaced or eliminated in other embodiments of the cleaning apparatus 1.

In some embodiments, the catch cup 11 is configured to provide an environment for cleaning the semiconductor wafer 5. The catch cup 11 is a circular cup having an open top. The upper portion of the cup wall tilts inward to facilitate retaining waste within the catch cup 11. The catch cup 11 is connected to an exhaust system via a liquid waste drain formed on a bottom wall 112. As a result, the catch cup 11 is able to catch and drain waste liquid solution for the wafer cleaning process via the liquid waste drain.

The transferring module 12 is configured to move the supply units. The transferring module 12 includes one or more driving elements 121, and a robot arm 122, in accordance with some embodiments. The driving element 121, such as a motor, is controlled by the control module and is coupled to the robot arm 122. The robot arm 122 is driven by the driving element to provide both radial and rotational movement in a fixed plane to move the first supply units 13 and 14 from one location within the cleaning apparatus 1 to another.

For example, with the transferring module 12, the first and second supply units 13 and 14 are transferred from a peripheral region of the cleaning apparatus 1 to a central region of the cleaning apparatus 1. At the peripheral region, the first and second supply units 13 and 14 are not positioned above the semiconductor wafer 5. At the center region, the first and second supply units 13 and 14 are positioned above the semiconductor wafer 5. Namely, the projections of the outlets for supply cleaning material of the first and second supply units 13 and 14 are located above the semiconductor wafer 5.

In some embodiments, the first supply unit 13 is mounted on the transferring module 12 and configured to supply a cleaning liquid to the semiconductor wafer 5. The cleaning liquid may include an aggregate of two or more substances. Several examples of the mixture are described below. For example, the cleaning liquid is a SC1 solution mixed with substances including $NH_4OH$, $H_2O_2$, and $H_2O$ in a selected ratio. The SC1 solution may be used to clean the wafer and to remove the organic compound and particulate matter that attaches to the substrate surface. Alternatively, the cleaning liquid may be a SC2 solution, mixed with a substance including HCl, $H_2O_2$, and $H_2O$ in a selected ratio. The SC2 solution may be used to clean the wafer and to remove the metal dregs that attach to the wafer surface. However, it should be appreciated that many variations and modifications can be made to embodiments of the disclosure.

The second supply unit 14 is mounted on the transferring module 12 and configured to spray a washing liquid to the semiconductor wafer 5. The washing liquid may include an aggregate of two or more substances. Several examples of the mixture are described below. For example, the washing liquid is a SC1 solution. Alternatively, the washing liquid may be a SC2 solution. In some embodiments, the washing liquid stored in the cleaning material source includes $CO_2$ water.

The shield plate 15 is positioned relative to the catch cup 11 and configured to supply a processing liquid, such as isopropyl alcohol (IPA), or processing gas to dry the semiconductor wafer 5. In some embodiments, the shield plate 15 is arranged to move along the central axis C. When the shield plate 15 is used to supply the processing liquid or discharge gas, the shield plate 15 is lowered to approach the semiconductor wafer 5.

Figure 2:
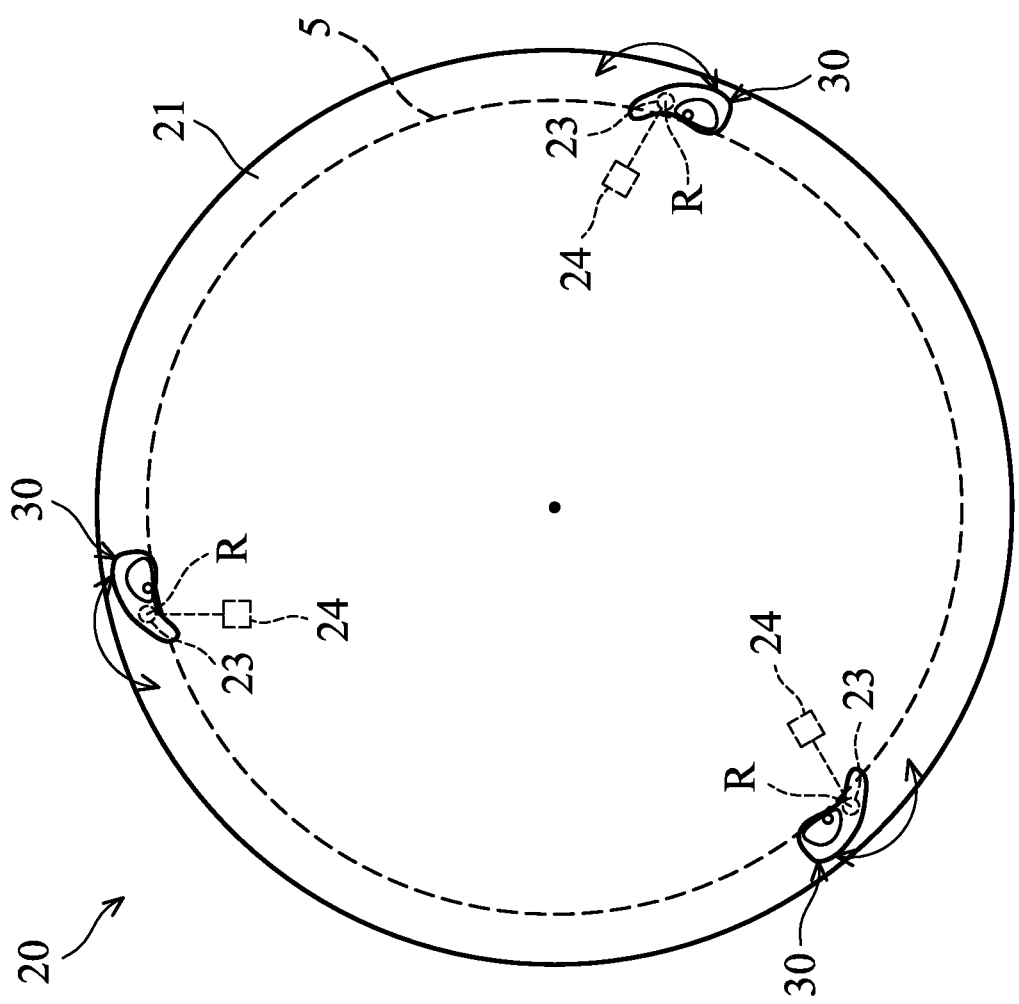
FIG. 2 shows a top view of the spin chuck as chuck pins are in closed positions, in accordance with some embodiments.

Still referring FIG. 1 with reference to FIG. 2, the spin chuck 20 is configured for holding, positioning, moving, rotating, and otherwise manipulating the semiconductor wafer 5. In some embodiments, the spin chuck 20 includes a spin base 21, a number of rotatable spindles 23, a number of driving members 24 (FIG. 2) and a number of chuck pins 30.

The spin base 21 has a disk shape and is disposed in the catch cup 11. In some embodiments, the spin base 21 is arranged to rotate about a central axis C. The spin base 21 may be also designed to be operable for translational and vertical motions. In addition, the spin chuck 20 may be designed to tilt or dynamically change the tilt angle.

The rotatable spindles 23, for example three rotatable spindles 23, are positioned relative to three through holes (not shown in figures) of the spin base 21 and pass through the three through holes. The three rotatable spindles 23 are arranged at equidistant intervals around the circumference of the spin base 21. In the ceases that three rotatable spindles 23 disposed on the spin base 21, the two neighboring rotatable spindles 23 are spaced at an angular interval of about 120 degrees.

The driving members 24, for example, but not limited to, three driving members, are configured to change the rotation angle of the rotatable spindles 23. The three driving members 24 may be positioned in the spin base 21 and connected to the three rotatable spindles 23 with or without a transmission mechanism (not shown in figures). The driving members 24 may include motors that generate a driving torque by using electricity. The driving members 24 may be connected to a controller (not shown in figures) to receive driving signals to change the rotation angle of the rotatable spindles 23 about rotation axes R.

The three chuck pins 30 are connected to the three rotatable spindles 23, so that rotation angle of each chuck pins 30 can be changed by rotating the rotatable spindles 23. When the three chuck pins 30 are rotated to a secured angle as shown in FIG. 2, the semiconductor wafer 5 can be secured over the spin base 21 by the chuck pins 30. A method for securing the semiconductor wafer 5 will be described in more details with reference of FIGS. 6-9.

The three chuck pins 30 may be operated in association with each other to clamp and unclamp the semiconductor wafer 5. Alternatively, one or two of the chuck pins 30 may operate independently of the other chuck pin 30. For example, one of the chuck pins 30 is not able to rotate relative to the spin base 21, and the rotation angle of the one of the chuck pin 30 is fixed. On the other hand, the other two chuck pins 30 are operated in association with each other to clamp and unclamp the semiconductor wafer 5.

In some embodiments, the spin chuck 20 is fitted with a suitable heating mechanism to heat the semiconductor wafer 5 to a desired temperature. For example, as shown in FIG. 1, the spin chuck 20 further includes a thermal plate 22. The thermal plate 22 is positioned among the three chuck pins 30. The thermal plate 22 can be heated by coils (not shown in figures) formed therein when an electric current is applied to the coils, so that the thermal plate 22 can be used to heat the semiconductor wafer 5. In some embodiments, the spin chuck 20 further includes a lifting mechanism (not shown in figures). The lifting mechanism is connected to the thermal plate 22 for facilitating a vertical movement of the thermal plate 22 relative to the spin base 21 so as to lift the semiconductor wafer 5.

The structural features of one of the chuck pins 30, in accordance with some embodiments, are described in details below.

Figure 3:
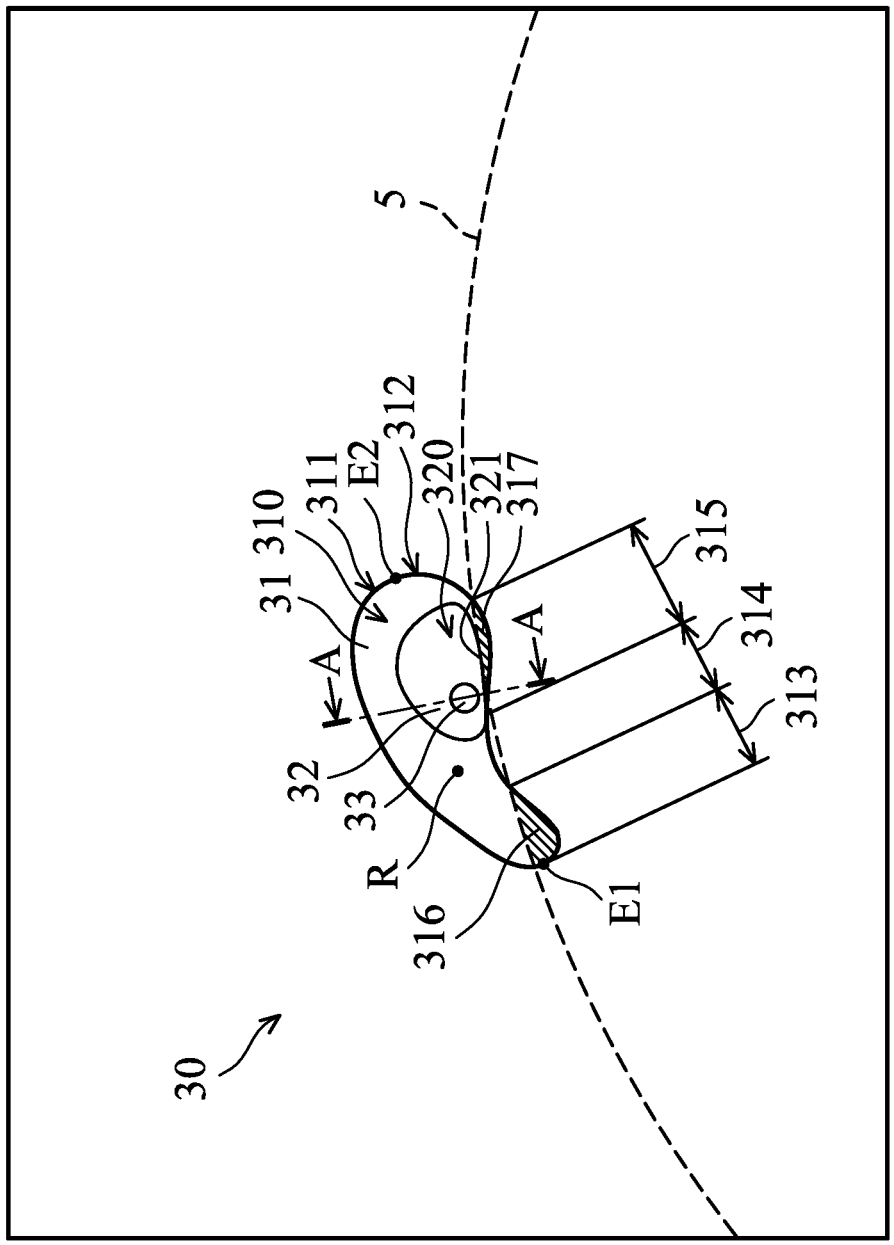
FIG. 3 shows an enlarged view of area M of FIG. 2.

Referring to FIG. 3, in some embodiments, the chuck pin 30 includes a supporter 31, a clamping member 32 and a guiding member 33. The supporter 31 is configured to support the semiconductor wafer 5 over the spin base 21 (FIG. 2). In some embodiment, the supporter 31 extends from a first end point E1 to a second end point E2. The first end point E1 and the second end point E2 are two points of the supporter 31 that are located farthest away from the rotation axis R.

As shown in FIG. 3, the supporter 31 has an outer edge 311 and an inner edge 312. Two ends of the outer edge 311 are connected to two ends of the inner edge 312 at the first end point E1 and the second end point E2. The outer edge 311 is located farther away from the central axis C of the spin base 21 (FIG. 2) than the inner edge 312.

In some embodiments, the inner edge 312 includes a first protruding segment 313, a recessed segment 314 and a second protruding segment 315. The first protruding segment 313 is located adjacent to the first end point E1. The recessed segment 314 is connected to one end of the first protruding segment 313 that is opposite to the other end of the first protruding segment 313 that is connected to the first end point E1. The second protruding segment 315 is separated from the first protruding segment 313 by the recessed segment 314.

In some embodiments, as shown in FIG. 3, the first protruding segment 313 and the second protruding segment 315 of the inner edge 312 has a convex curve, and the recessed segment 314 of the inner edge 312 has a concave curve. Therefore, there are two embossments located at two sides of the recessed segment 314. Two regions of a top surface 310 of the supporter 31 that correspond to the two embossments are referred to as supporting regions 316 and 317. The supporting regions 316 and 317 are configured to support the semiconductor wafer 5 when the semiconductor wafer 5 is placed on the supporter 31.

The clamping member 32 is configured to secure the semiconductor wafer 5 over the spin base 21 (FIG. 2). In some embodiments, the clamping member 32 is positioned on the top surface 310 of the supporter 31 and located between the rotation axis R and the second end point E2. Namely, the clamping member 32 is offset from the rotation axis R. The clamping member 32 has a lateral surface 321. The lateral surface 321 may be a flat surface. Alternatively, the lateral surface 321 may be a curved surface. The lateral surface 321 is immediately adjacent to the supporting region 317 that corresponds to the second protruding segment 315 of the inner edge 312.

The guiding member 33 is configured to guide the semiconductor wafer 5 while the semiconductor wafer 5 is moved relative to the supporter 31. In some embodiments, the guiding member 33 is positioned on a top surface 320 of the clamping member 32. The top surface 320 may be parallel to the top surface 310 of the supporter 31. In some embodiments, a cross-section of the guiding member 33 is smaller than a cross-section of the clamping member 32. The cross-section of the guiding member 33 may be circular, rectangular, polygonal, or a combination thereof.

Figure 4:
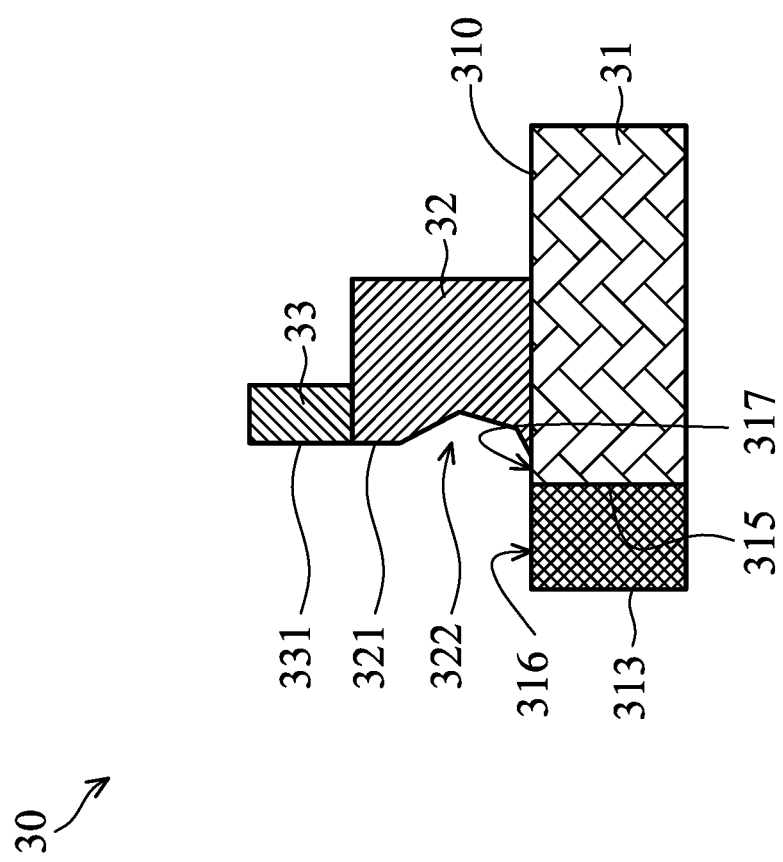
FIG. 4 shows a cross-sectional view of the chuck pin taken along line A-A of FIG. 3.

FIG. 4 shows a cross-sectional view of the chuck pin 30 taken along line A-A of FIG. 3. In some embodiments, as shown in FIG. 4, the guiding member 33 has an outer surface 331 that is flush with the lateral surface 321 of the clamping member 32. In addition, a groove 322 is formed on the lateral surface 321 of the clamping member 32. The groove 322 is immediately adjacent to the top surface 310 of the clamping member 32. The groove 322 may have a shape that is compatible with the shape of an outer edge of the semiconductor wafer 5. For example, the groove 322 has a trapezoidal shape. However, it should be appreciated that many variations and modifications can be made to embodiments of the disclosure. In some other embodiments, the shape of the groove 322 is different from the shape of the outer edge of the semiconductor wafer 5.

Figure 5:
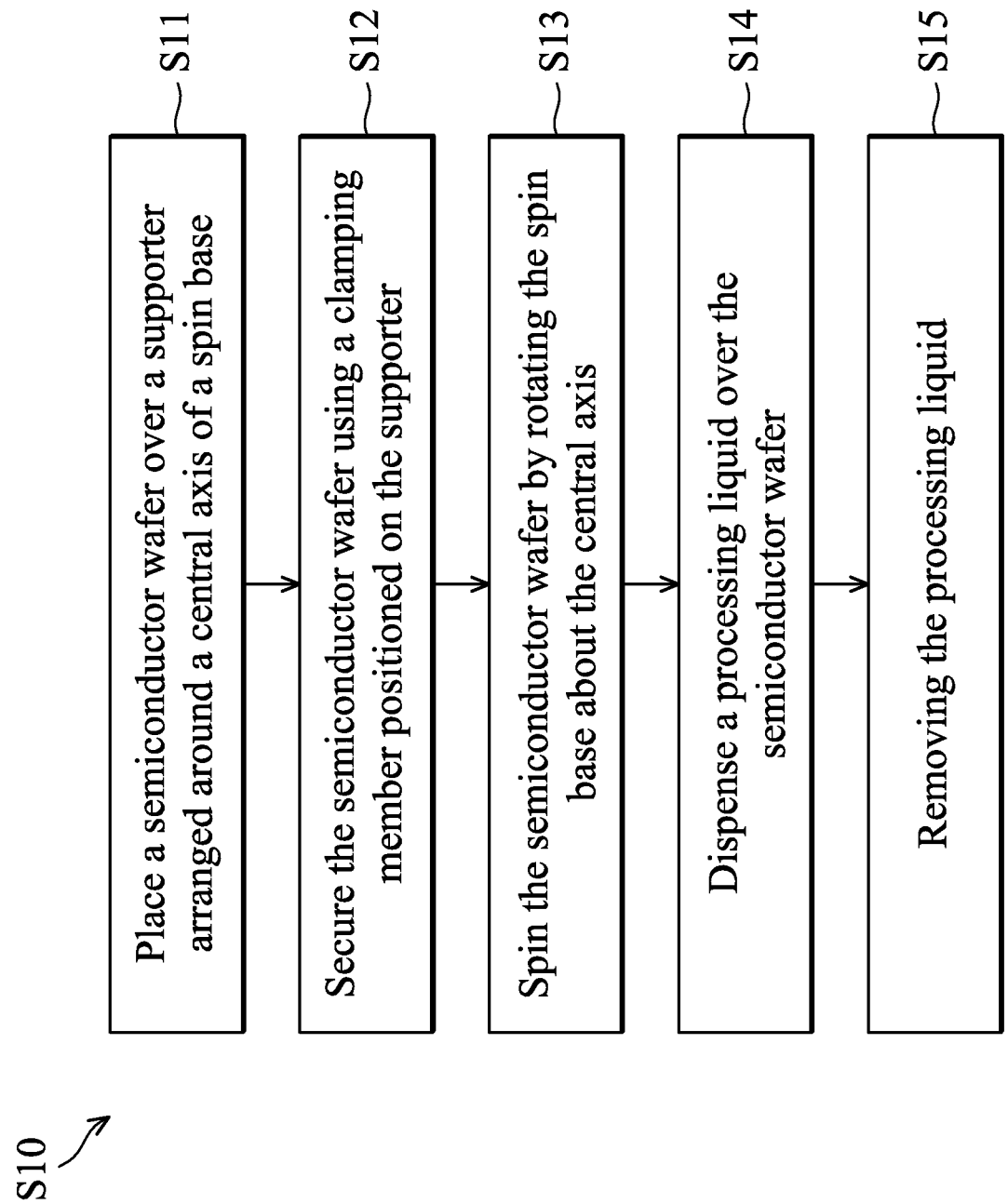
FIG. 5 is a flow chart of a method for cleaning a semiconductor wafer, in accordance with some embodiments.

FIG. 5 is a flow chart illustrating a method S10 for cleaning a semiconductor wafer 5, in accordance with some embodiments. For illustration, the flow chart will be described along with the schematic views shown in FIGS. 1, 3 and 6-13. Some of the stages described can be replaced or eliminated for different embodiments.

Figure 6:
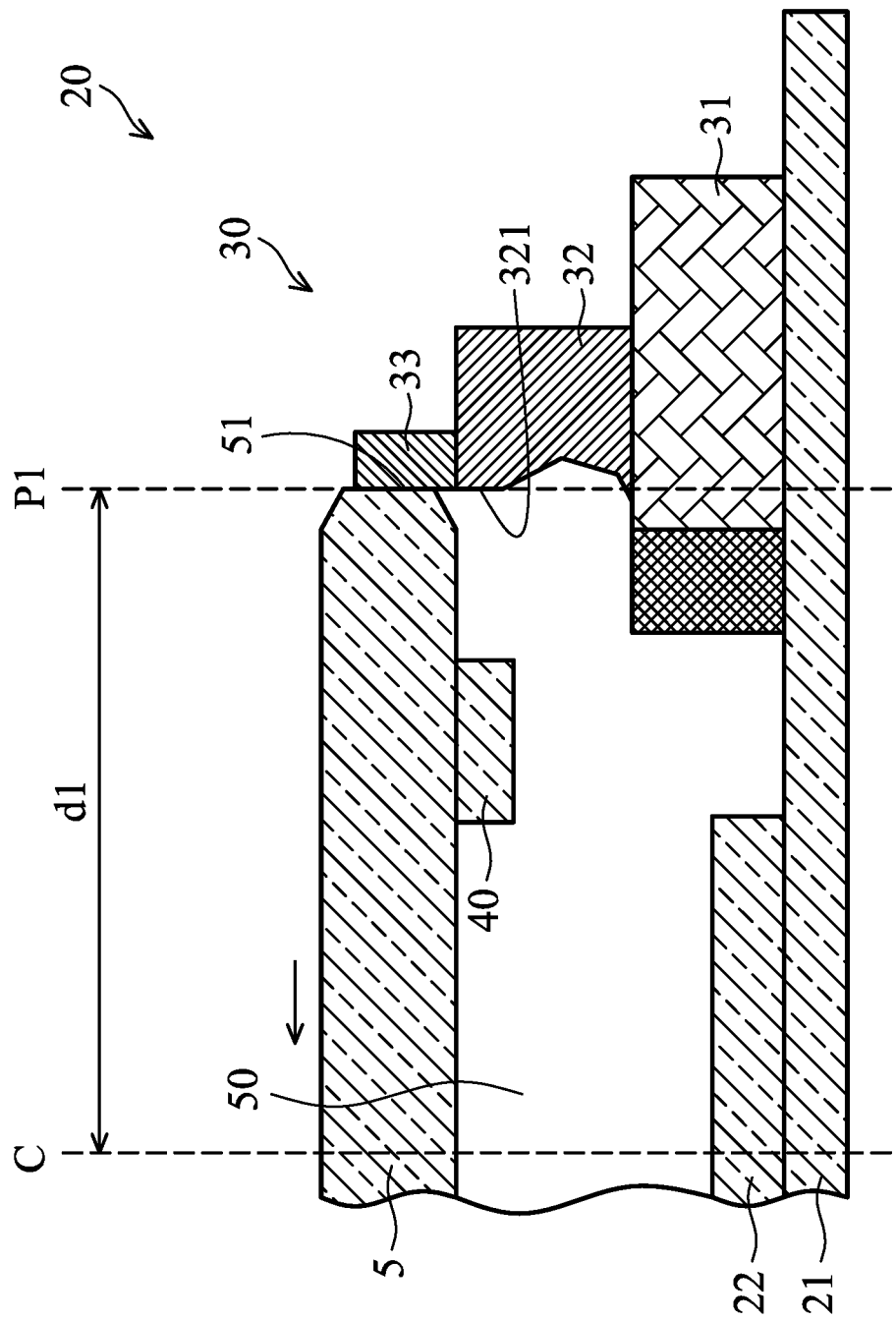
FIG. 6 shows a cross-sectional view of one stage of a method for cleaning a semiconductor wafer in which the semiconductor wafer is moving relative to a chuck pin, in accordance with some embodiments.

The method S10 includes operation S11, in which a semiconductor wafer 5 is placed on the chuck pin 30 of the spin chuck 20. In some embodiments, as shown in FIG. 6, before the placement of the semiconductor wafer 5 over the chuck pin 30, the chuck pin 30 is rotated at a guiding angle. At the guiding angle, the lateral surface 321 of the clamping member 32 is located at a first plane P1. The first plane P1 is distant from the central axis C of the spin base 21 by a distance d1. The distance d1 may be slightly greater than the radius of the semiconductor wafer 5.

In some embodiments, the semiconductor wafer 5 is transferred to the chuck pin 30 by a robotic blade 40. The robotic blade 40 lowers the semiconductor wafer 5 along a direction that is parallel to the central axis C to place the semiconductor wafer 5 over the chuck pin 30. In some embodiments, as shown in FIG. 6, due to a misalignment of the robotic blade 40, the outer edge 51 of the semiconductor wafer 5 may be abutted against the guiding member 33 during the movement of the semiconductor wafer 5 toward the supporter 31 and leads to movement of the semiconductor wafer 5 in a horizontal direction. As a result, the semiconductor wafer 5 is guided by the guiding member 33 and moved in a direction indicated by arrow shown in FIG. 6 so as to allow the center of the semiconductor wafer 5 to be aligned with the central axis C.

Figure 7:
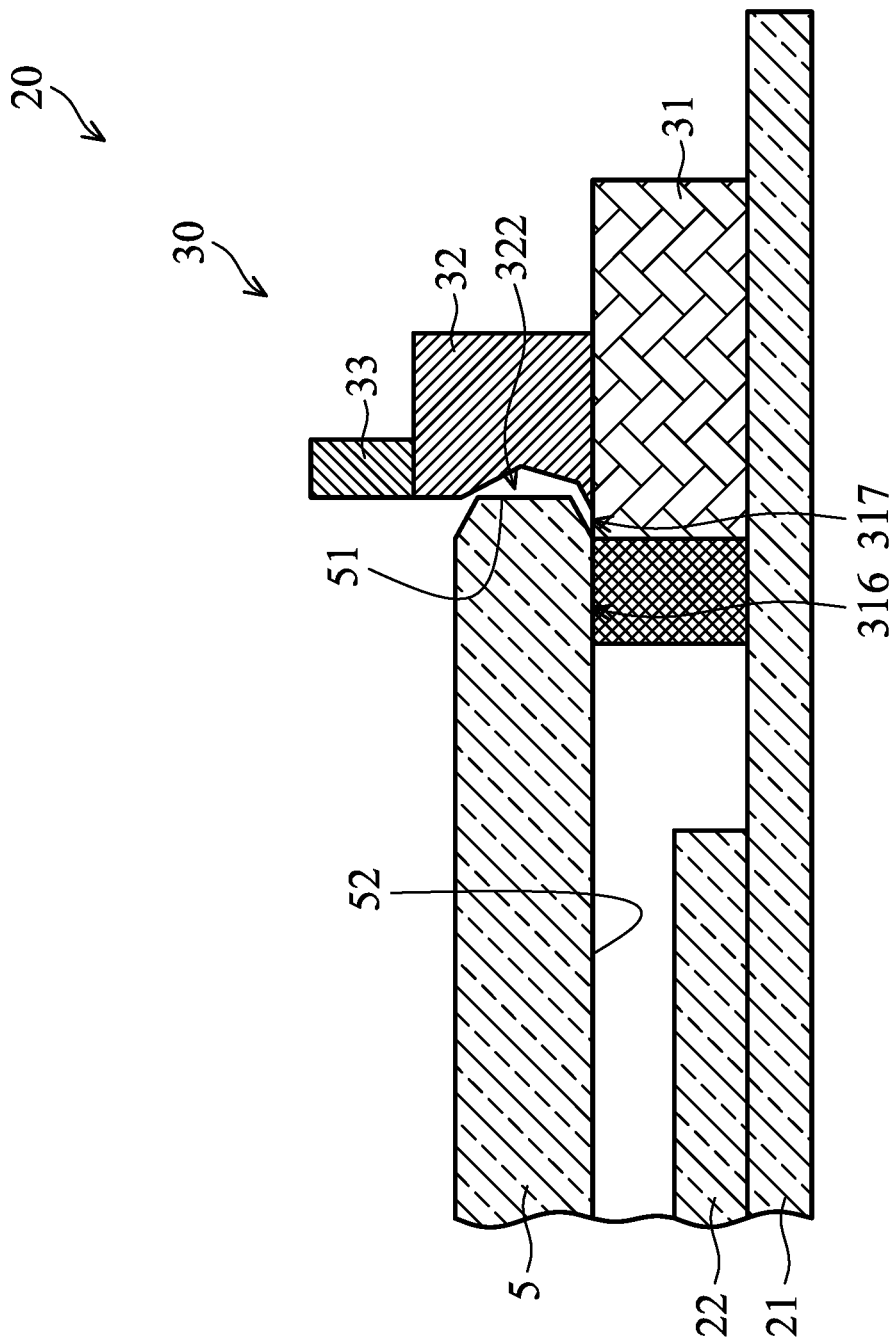
FIG. 7 shows a cross-sectional view of one stage of a method for cleaning a semiconductor wafer in which the semiconductor wafer is placed on a supporter of a chuck pin, in accordance with some embodiments.

After the semiconductor wafer 5 is placed on the chuck pin 30, the rear surface 52 of the semiconductor wafer 5 is supported by the supporting regions 316 and 317 of the supporter 31, and the outer edge 51 of the semiconductor wafer 5 is located adjacent to the groove 322, as shown in FIG. 7. However, it should be appreciated that many variations and modifications can be made to embodiments of the disclosure. In some other embodiments, after the semiconductor wafer 5 is placed on the chick pin 30 and before the semiconductor wafer 5 is secured by the clamping member 32, the supporting region 317 of the chuck pin 30 is not covered by the semiconductor wafer 5, and the semiconductor wafer 5 is supported by the supporting region 316.

Figure 8:
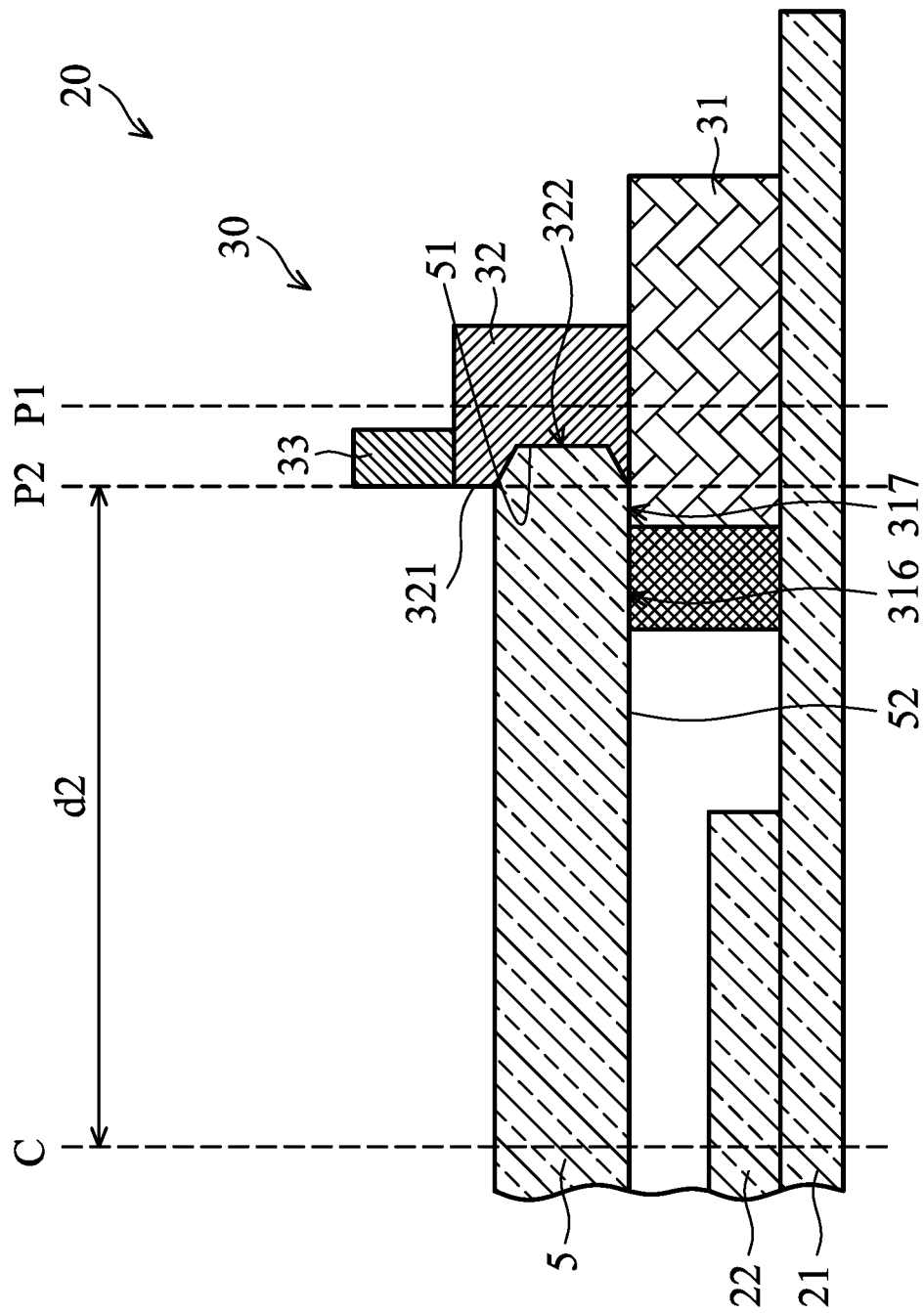
FIG. 8 shows a cross-sectional view of one stage of a method for cleaning a semiconductor wafer in which the semiconductor wafer is secured by a chuck pin, in accordance with some embodiments.

The method S10 also includes operation S12, in which the semiconductor wafer 5 is secured by the clamping member 32. In some embodiments, to secure the semiconductor wafer 5 with the clamping member 32, the chuck pin 30 is rotated at a securing angle, as shown in FIG. 8. At the securing angle, the lateral surface 321 of the clamping member 32 is located at a first plane P2. The second plane P2 is distant from the central axis C by a distance d2. The distance d2 is smaller than the distance d1 (FIG. 6).

In some embodiments, when the lateral surface 321 is located at the second plane P2, the outer edge 51 of the semiconductor wafer 5 is inserted into the groove 322 of the clamping member 32. In addition, the first supporting region 316 and the second supporting region 317 are located below the semiconductor wafer 5, and the recessed segment 314 (FIG. 3) is separated from the outer edge 51 of the semiconductor wafer 5. Namely, a region of the rear surface 52 of the semiconductor wafer 5 located between the first supporting region 316 and the second supporting region 317 is not supported by the supporter 31.

In some embodiments, when the semiconductor wafer 5 is secured by the clamping member 32, the rear surface 52 of the semiconductor wafer 5 is in contact with the supporting regions 316 and 317, but the embodiments should not be limited thereto. In some other embodiments, the rear surface 52 of the semiconductor wafer 5 may be separated from the supporting regions 316 and 317, and a narrow space (such as narrow space S0 shown in FIG. 9) having minute width is formed between the rear surface 52 of the semiconductor wafer 5 and the supporting regions 316 and 317. In addition, a narrow space (such as narrow space S1 shown in FIG. 9) having minute width may be formed between the outer edge 51 of the semiconductor wafer 5 and the lateral surface 321 or inner walls of the groove 322.

Figure 9:
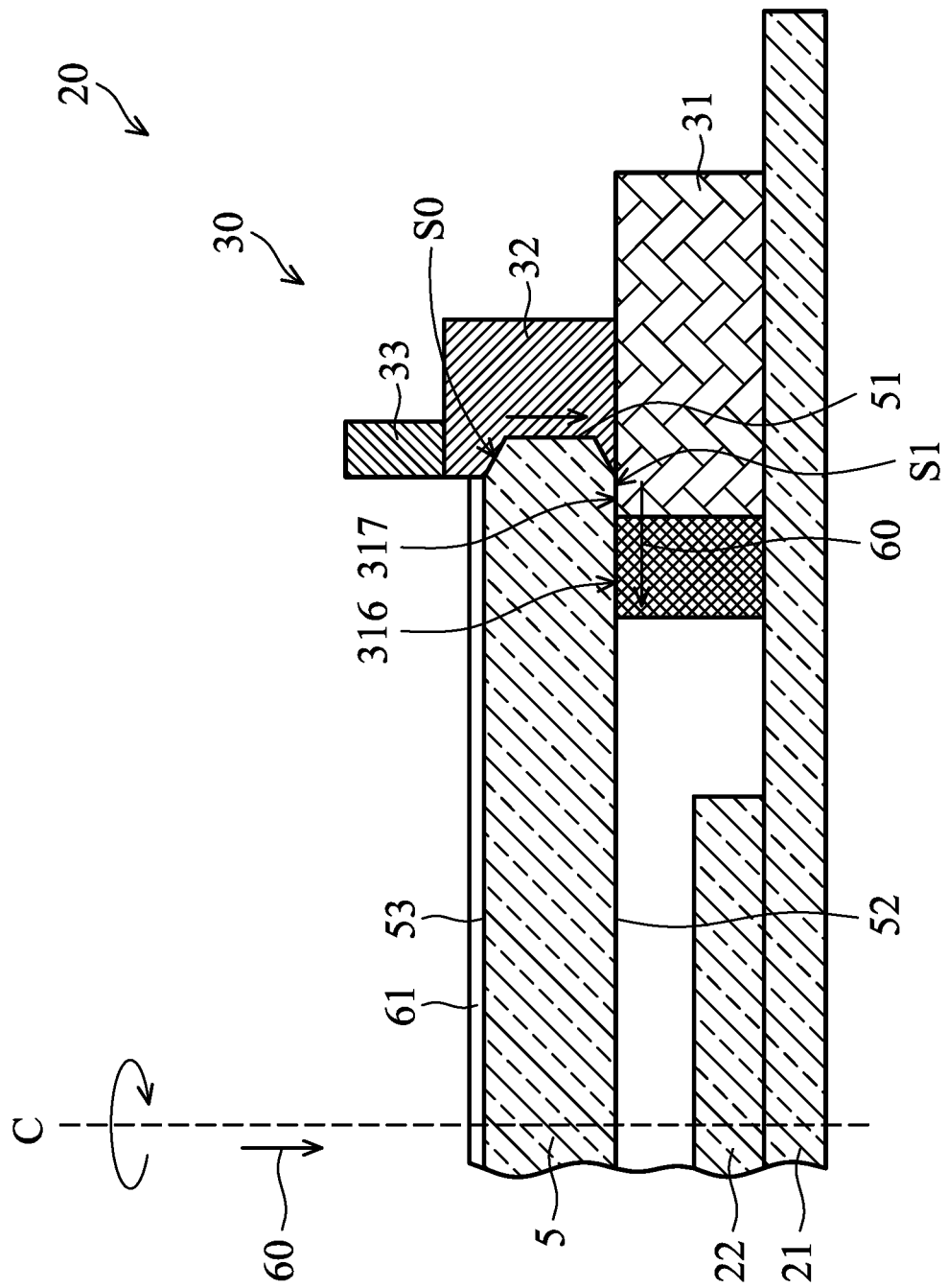
FIG. 9 shows a cross-sectional view of one stage of a method for cleaning a semiconductor wafer in which a cleaning liquid is dispensed over the semiconductor wafer, in accordance with some embodiments.

The method S10 also includes operation S13, in which the semiconductor wafer 5 is rotated by the spin base 21 about the central axis C, as shown in FIG. 9. In some embodiments, the rotation speed of the semiconductor wafer 5 may be maintained at or close to zero (e.g., the rotation speed may be lower than 20 rpm).

The method S10 also includes operation S14, in which a processing liquid 60 is dispensed over a front surface 53 of the semiconductor wafer 5. In some embodiments, as shown in FIG. 9, the processing liquid 60 is supplied to a center portion of the front surface 53 of the semiconductor wafer 5 from the shield plate 15 (FIG. 1). The processing liquid 60 may be acted upon by centrifugal force generated by the rotation of the semiconductor wafer 5 to flow toward the outer edge 51 of the semiconductor wafer 5 between the front surface 53 and the rear surface 52. Thus, a processing liquid film 61 having a predetermined thickness (e.g., about 1 mm) is formed on the front surface 53 of the semiconductor wafer 5.

The dispensing of the processing liquid 60 may be performed in a drying process so as to dry the semiconductor wafer 5. In some embodiments, before the drying process, a prior-stage cleaning process is performed over the semiconductor wafer 5. In the prior-stage cleaning process, a cleaning liquid (such as SC1 solution) or a washing liquid (such as SC2 solution) is supplied from the first supply unit 13 (FIG. 1) or the second supply unit 14 (FIG. 1) so as to remove particles or oxidation material on the semiconductor wafer 5. After the semiconductor wafer 5 is cleaned by the cleaning liquid or the washing liquid, the processing liquid 60 is supplied over the semiconductor wafer 5 to remove the cleaning liquid or the washing liquid used in the prior-stage cleaning process. The processing liquid 60 may be any suitable liquid having a smaller surface tension than DIW (water, rinse liquid). For example, the processing liquid includes isopropyl alcohol (IPA), acetone, alcohol, monoethanolamine (MEA) and combinations thereof.

It should be noted that due to capillary action, a portion of the processing liquid 60 may flow in to the narrow spaces S0 and S1 between the semiconductor wafer 5 and the chuck pin 30. However, the amount of flow of the processing liquid 60 caused by the capillary action is well controlled to an acceptable value by reducing the contact area between the chuck pin 30 and the semiconductor wafer 5 due to the structural features of the chuck pin 30, in the embodiments of the present disclosure. Therefore wastage of the processing liquid 60 can be mitigated or prevented. In addition, the drying process can be properly controlled because the processing liquid film 61 can be maintained at a predetermined thickness.

Specifically, because of the recessed segment 314 (FIG. 3) formed on the inner edge 312 of the supporter 31, the contact area between the semiconductor wafer 5 and the supporter 31 is reduced. As a result, the processing liquid 60 is not allowed to be exhausted via the region of the rear surface 52 located between two neighboring regions of the rear surface 52 that are supported by the supporting regions 316 and 317.

In addition, because the guiding member 33 is positioned on the clamping member 32 rather than directly positioned on the supporter 31 as a conventional chuck pin, only one lateral contact area is formed between each of the chuck pins 30 and the semiconductor wafer 5. Consequently, waste of the processing liquid 60 due to excessive flowing through a narrow space between a guiding member of the conventional chuck pin and the semiconductor wafer 5 can be avoided.

Figure 10:
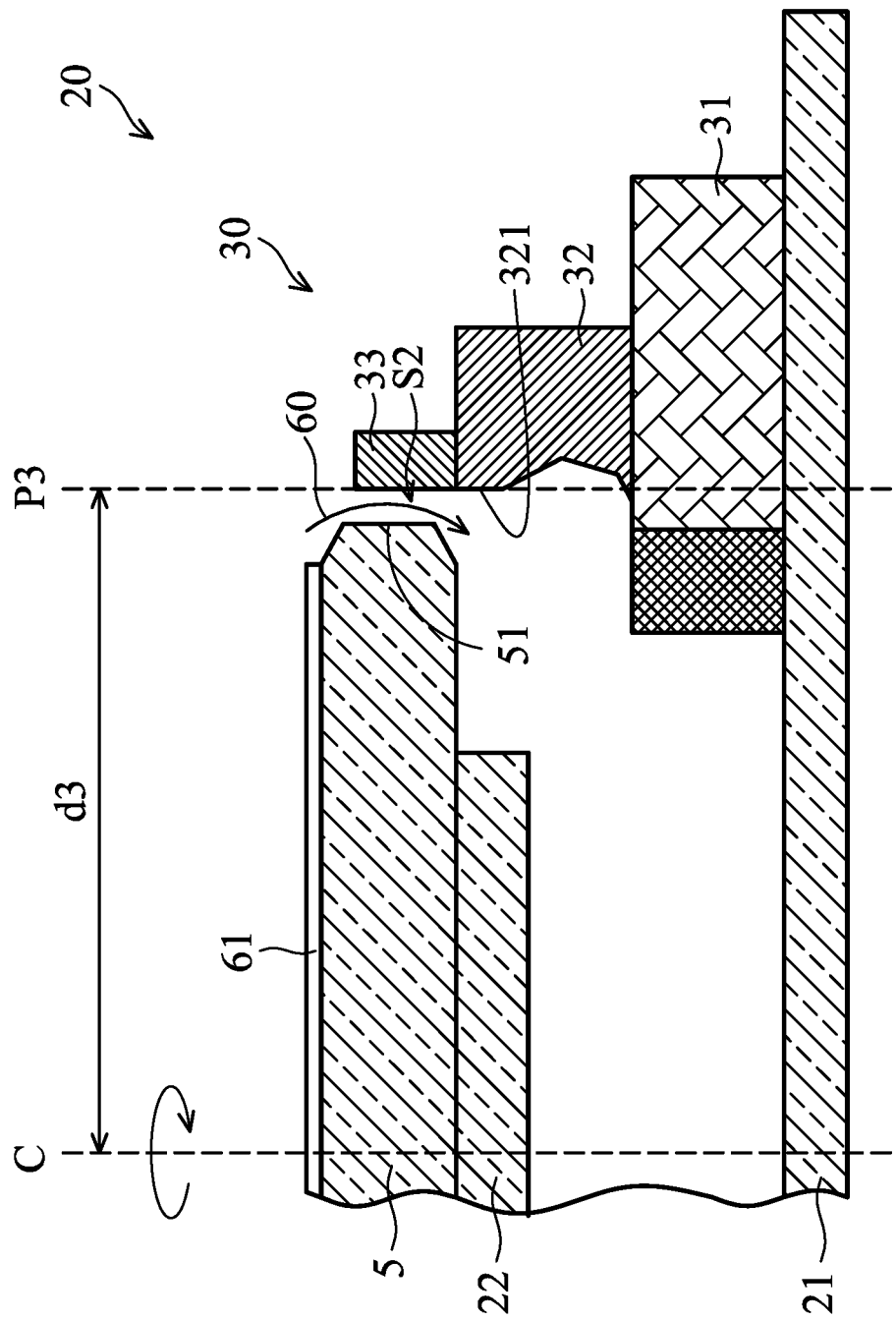
FIG. 10 shows a cross-sectional view of one stage of a method for cleaning a semiconductor wafer in which the semiconductor wafer is lifted by a thermal plate, in accordance with some embodiments.

In some embodiments, after the formation of the processing liquid film 61 over the semiconductor wafer 5, the processing liquid film 61 is heated. To heat the processing liquid film 61, the chuck pin 30 is rotated at a thermal processing angle, as shown in FIG. 10. At the thermal processing angle, the lateral surface 321 of the clamping member 32 is located at a plane P3. The plane P3 may be distant from the central axis C by a distance d3. The distance d3 may be the same as the distance d1. Alternatively, the distance d3 is greater than the distance d1 (FIG. 6) between the plane P1 and the central axis C.

The distance d3 may be sufficiently large, so that a capillary action that allowing a flowing of the processing liquid 60 between the guiding member 33 (or the clamping member 32) and the outer edge 51 of the semiconductor wafer 5 can be mitigated or prevented. As a result, wastage of the processing liquid 60 and a decreasing yield of the semiconductor wafer 5 can be avoided.

After the chuck pin 30 is moved to the thermal processing angle, as shown in FIG. 10, the semiconductor wafer 5 is moved up to an upper position via the thermal plate 22, and a film heating process is performed. In the film heating process, the processing liquid film 61 is heated and maintained at a temperature ranging between about 50° C. and 150° C. The film heating process may have a duration between about 20 and 150 seconds. In some embodiments, the semiconductor wafer 5 is rotated during the film heating process. The rotation speed of the semiconductor wafer 5 may be maintained at or close to zero (e.g., the rotation speed may be lower than 20 rpm) during all or part of the film heating process.

Due to the rotation of the semiconductor wafer 5, a portion of processing liquid 60 may be discharged through a narrow space S2, formed between the guiding member 33 and the semiconductor wafer 5, as shown in FIG. 10. However, by properly controlling the thermal processing angle, the narrow space S2 may be adjusted to have sufficient large width, so that the waste of the processing liquid due to capillary action will not occur in the film heating process.

Figure 11:
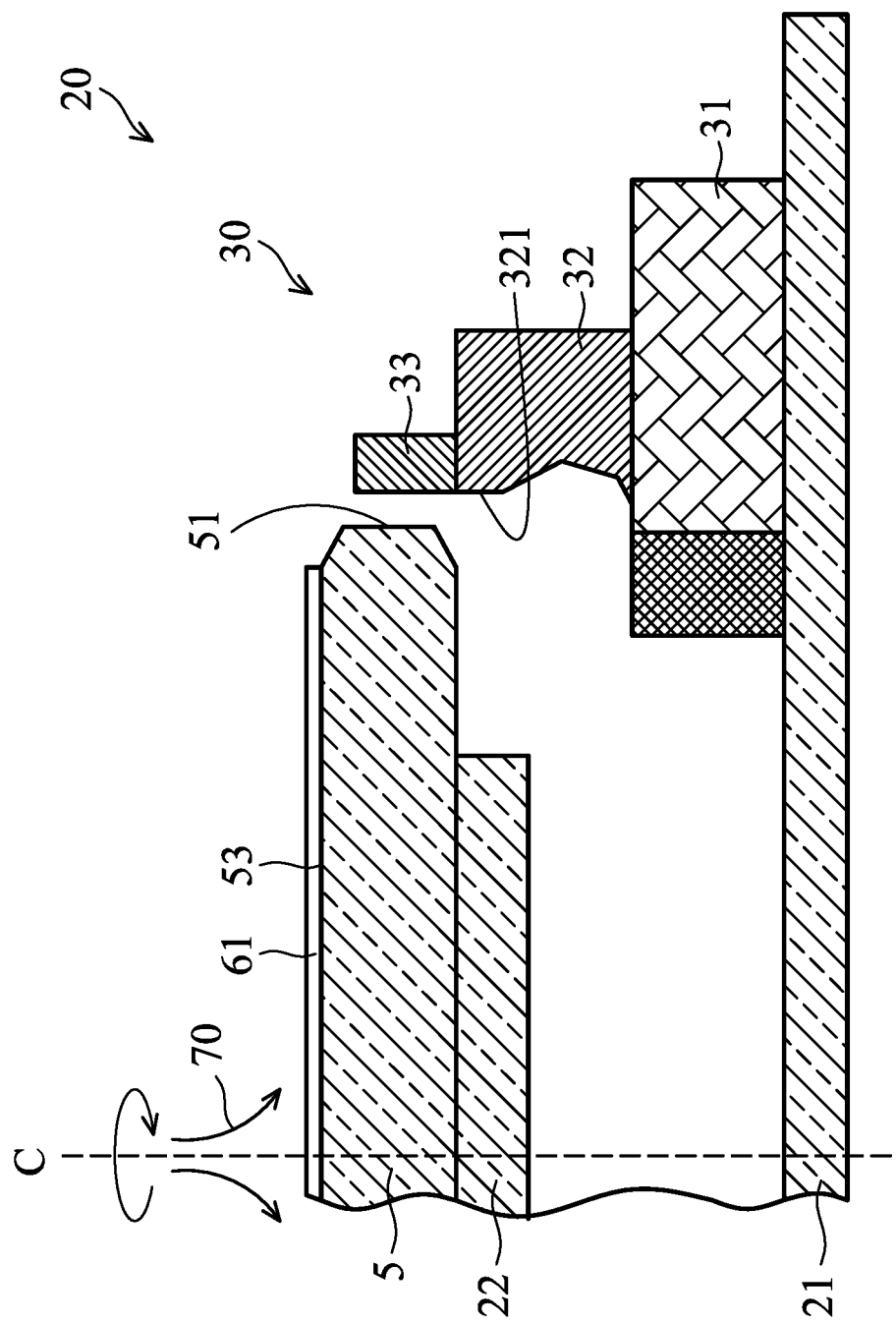
FIG. 11 shows a cross-sectional view of one stage of a method for cleaning a semiconductor wafer in which a gas is discharged over the semiconductor wafer, in accordance with some embodiments.

The method S10 also includes operation S15, in which the processing liquid film 61 is removed. In some embodiments, the processing liquid film 61 is removed by supplying a processing gas 70 over the semiconductor wafer 5, as shown in FIG. 11. During the supply of the processing gas, the semiconductor wafer 5 may be rotated at the rotation speed of the semiconductor wafer 5 to 10 to 500 rpm, for example, to increase the efficiency of removing the processing liquid film 61. In some embodiments, the processing gas 70 includes an inert gas, such as nitrogen gas.

Figure 12:
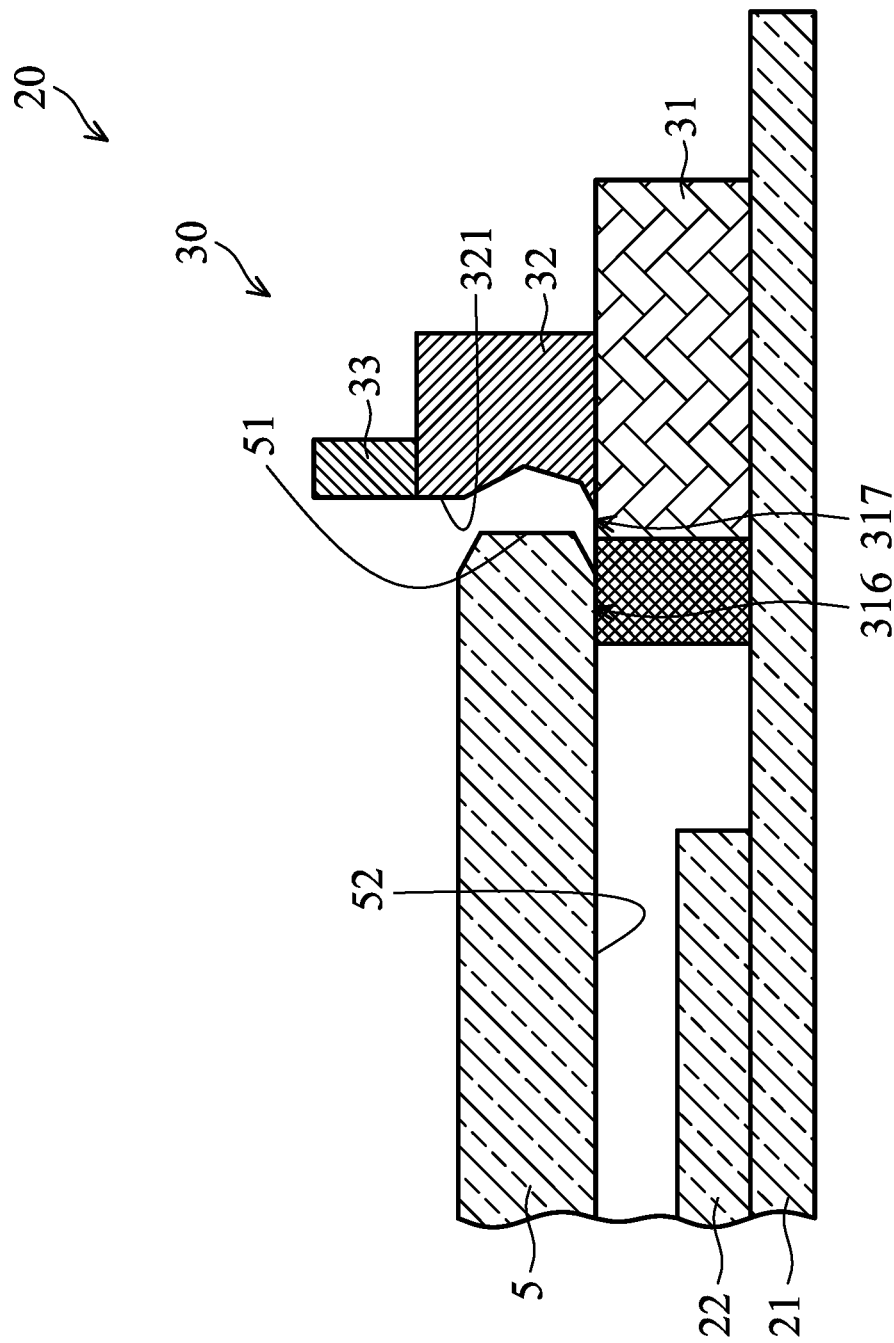
FIG. 12 shows a cross-sectional view of one stage of a method for cleaning a semiconductor wafer in which the semiconductor wafer is placed on a supporter, in accordance with some embodiments.
Figure 13:
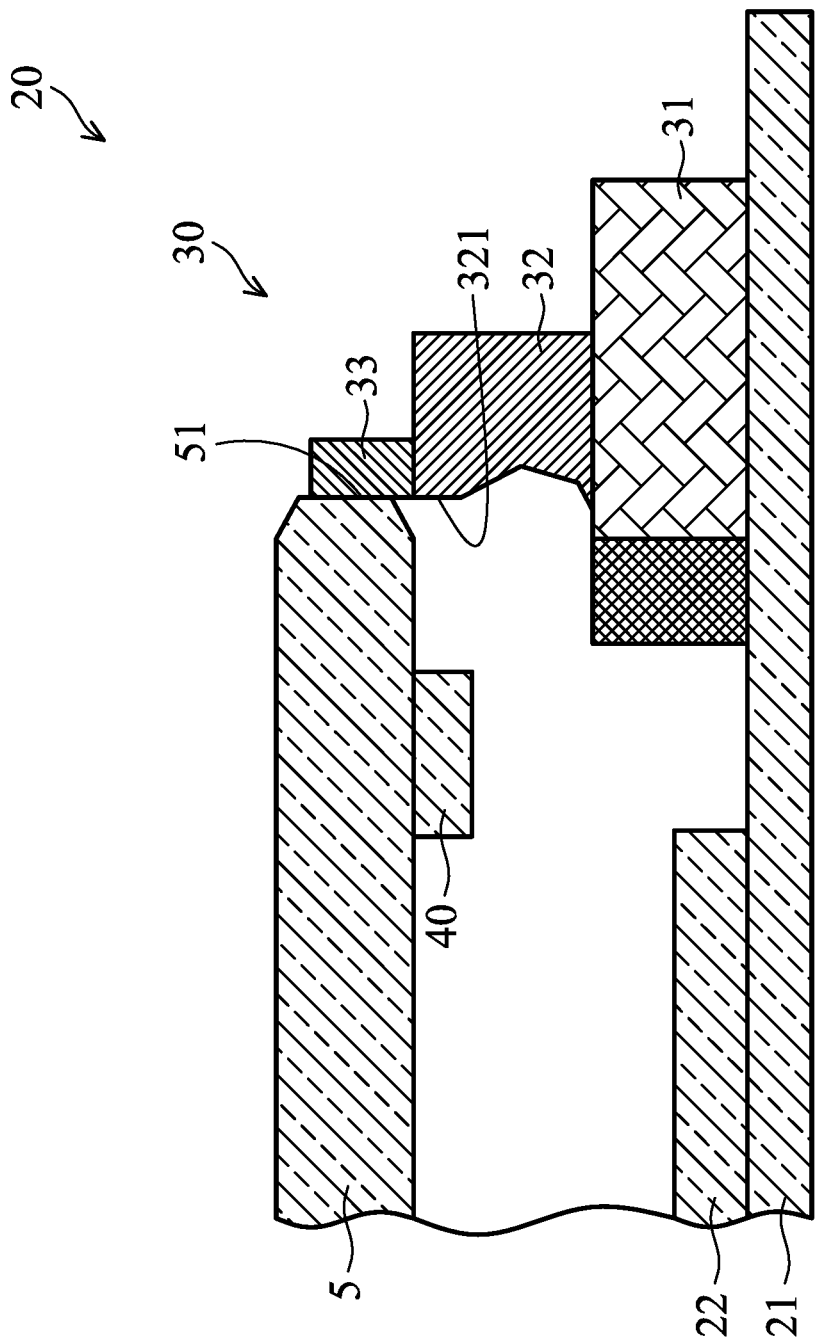
FIG. 13 shows a cross-sectional view of one stage of a method for cleaning a semiconductor wafer in which the semiconductor wafer is removing from a chuck pin, in accordance with some embodiments.

After the processing liquid film 61 is completely removed from the front surface 53 of the semiconductor wafer 5, as shown in FIG. 12, the semiconductor wafer 5 is lowered down to a lower position by the thermal plate 22, at which the semiconductor wafer 5 is supported by the supporter 31. Afterwards, as shown in FIG. 13, the semiconductor wafer 5 is removed from the spin chuck 20 by the robotic blade 40, and the method S10 for cleaning the semiconductor wafer 5 is completed.

Embodiments of a method and apparatus for cleaning a semiconductor wafer utilize a number of chuck pins for fixing the semiconductor wafer. The contact area between the semiconductor wafer and the chuck pins is decreased by placing the guiding member on the clamping member and by forming the recess segment on the supporter. Because it is not easy for the processing liquid dispensed on the semiconductor wafer flowing along narrow spaces between the semiconductor wafer and the chuck pins, it is possible to reduce the waste of the processing liquid. Therefore, the manufacturing cost is reduced. In addition, the product yield is improved due to the properly controlling of the film thickness of the processing liquid over the semiconductor wafer.

In accordance with some embodiments, a semiconductor wafer cleaning apparatus is provided. The semiconductor wafer cleaning apparatus includes a spin base rotatable about a central axis. The semiconductor wafer cleaning apparatus further includes a number of chuck pins positioned on the spin base and arranged around the center axis. Each of the chuck pins includes a supporter, a clamping member and a guiding member. The supporter is configured to support a semiconductor wafer over the spin base. The clamping member is positioned over the supporting member and configured to secure the semiconductor wafer. The guiding member is positioned over the clamping member. The guiding member is configured to guide the semiconductor wafer while the semiconductor wafer is moved relative to the supporter.

In accordance with some embodiments, a semiconductor wafer cleaning apparatus is provided. The semiconductor wafer cleaning apparatus includes a spin base rotatable about a central axis. The semiconductor wafer cleaning apparatus further includes a number of chuck pins positioned on the spin base and arranged around the center axis. Each of the chuck pins includes a supporter, a clamping member and a guiding member. The supporter includes two supporting regions. The two supporting regions are arranged in such a way that when the semiconductor wafer is positioned over the spin base a segment of an outer edge of the semiconductor wafer is located between the two supporting regions and separated from the supporter in a top view. The clamping member is positioned over the supporting member and configured to secure the semiconductor wafer. The guiding member is positioned over the clamping member. The guiding member is configured to guide the semiconductor wafer while the semiconductor wafer is moved relative to the supporter.

In accordance with some embodiments, a method for cleaning a semiconductor wafer is provided. The method includes placing a semiconductor wafer over a supporter arranged around a central axis of a spin base. The method further includes securing the semiconductor wafer using a clamping member positioned on the supporter. The movement of the semiconductor wafer during the placement of the semiconductor wafer over the supporter is guided by a guiding member located over the clamping member. The method also includes spinning the semiconductor wafer by rotating the spin base about the central axis. In addition, the method includes dispensing a processing liquid over the semiconductor wafer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor wafer cleaning apparatus, comprising:
   a spin base rotatable about a central axis; and
   a plurality of chuck pins positioned on the spin base and arranged around the center axis, wherein each of the chuck pins comprises:
   a supporter configured to support a semiconductor wafer over the spin base;
   a clamping member positioned over the supporter and configured to secure the semiconductor wafer, wherein the clamping member has a lateral surface, and a groove is formed on the lateral surface for receiving an outer edge of the semiconductor wafer; and
   a guiding member positioned over a top of the groove of the clamping member and configured to guide the semiconductor wafer while the semiconductor wafer is moved relative to the supporter,
   wherein the supporter has an inner edge, and a recessed segment of the inner edge is separated from an outer edge of the semiconductor wafer when the semiconductor wafer is secured by the clamping member,
wherein the supporter has a first supporting region and a second supporting region arranged at two sides of the recessed segment, and the first supporting region and the second supporting region are located below the semiconductor wafer when the semiconductor wafer is secured by the clamping member.

2. The semiconductor wafer cleaning apparatus as claimed in claim 1, wherein an outer surface of the guiding member is flush with the lateral surface.

3. The semiconductor wafer cleaning apparatus as claimed in claim 1, wherein when the semiconductor wafer is secured by the clamping member, the lateral surface is in direct contact with the semiconductor wafer.

4. The semiconductor wafer cleaning apparatus as claimed in claim 1, wherein a cross-section of the guiding member is smaller than a cross-section of the clamping member.

5. A semiconductor wafer cleaning apparatus, comprising:
a spin base rotatable about a central axis; and
a plurality of chuck pins positioned on the spin base and arranged around the central axis, wherein each of the chuck pins comprises:
a supporter comprising two supporting regions arranged in such a way that when a semiconductor wafer is positioned over the spin base, a segment of an outer edge of the semiconductor wafer is located between the two supporting regions of the supporter and separated from the supporter in a top view;
a clamping member positioned over the supporter and configured to secure the semiconductor wafer; and
a guiding member positioned over the clamping member and configured to guide the semiconductor wafer while the semiconductor wafer is moved relative to the supporter.

6. The semiconductor wafer cleaning apparatus as claimed in claim 5, wherein the clamping member has a lateral surface, and when the semiconductor wafer is secured by the clamping member, the lateral surface is in direct contact with the semiconductor wafer;
wherein an outer surface of the guiding member is flush with the lateral surface.

7. The semiconductor wafer cleaning apparatus as claimed in claim 5, wherein the clamping member has a lateral surface, and when the semiconductor wafer is secured by the clamping member, the lateral surface is in direct contact with the semiconductor wafer;
wherein a groove is formed on the lateral surface for receiving an outer edge of the semiconductor wafer.

8. The semiconductor wafer cleaning apparatus as claimed in claim 5, wherein a cross-section of the guiding member is smaller than a cross-section of the clamping member.

9. The semiconductor wafer cleaning apparatus as claimed in claim 5, wherein the two supporting regions are overlapped by the semiconductor wafer in the top view.

10. The semiconductor wafer cleaning apparatus as claimed in claim 5, wherein one of the two supporting regions is directly connected to the clamping member.

11. A semiconductor wafer cleaning apparatus, comprising:
a spin base rotatable about a central axis; and
a plurality of chuck pins positioned on the spin base and arranged around the center axis, wherein each of the chuck pins comprises:
a supporter rotated about a rotation axis and configured to support a semiconductor wafer over the spin base, wherein the rotation axis passes through the supporter in a top view, and the supporter comprises two supporting regions arranged in such a way that when a semiconductor wafer is positioned over the spin base, a segment of an outer edge of the semiconductor wafer is located between the two supporting regions of the supporter and separated from the supporter in a top view;
a clamping member positioned over the supporter and configured to secure the semiconductor wafer, wherein the clamping member is offset from the rotation axis; and
a guiding member positioned over the clamping member and configured to guide the semiconductor wafer while the semiconductor wafer is moved relative to the supporter.

12. The semiconductor wafer cleaning apparatus as claimed in claim 11, wherein the clamping member has a lateral surface, and when the semiconductor is secured by the clamping member, the lateral surface is in direct contact with the semiconductor wafer;
wherein an outer surface of the guiding member is flush with the lateral surface.

13. The semiconductor wafer cleaning apparatus as claimed in claim 11, wherein the clamping member has a lateral surface, and when the semiconductor wafer is secured by the clamping member, the lateral surface is in direct contact with the semiconductor wafer;
wherein a groove is formed on the lateral surface for receiving an outer edge of the semiconductor wafer.

14. The semiconductor wafer cleaning apparatus as claimed in claim 11, further comprising a plurality of rotatable spindles disposed on the spin base, and the plurality of rotatable spindles are arranged at equidistant intervals around a circumference of the spin base.

15. The semiconductor wafer cleaning apparatus as claimed in claim 11, wherein the supporter has two supporting regions configured to support the semiconductor wafer when the semiconductor wafer is placed on the supporter.

16. The semiconductor wafer cleaning apparatus as claimed in claim 11, wherein a top surface of the clamping member is parallel to a top surface of the supporter.

17. The semiconductor wafer cleaning apparatus as claimed in claim 11, wherein a cross-section of the guiding member is smaller than a cross-section of the clamping member.

18. The semiconductor wafer cleaning apparatus as claimed in claim 11, further comprising a thermal plate positioned among the plurality of chuck pins.

19. The semiconductor wafer cleaning apparatus as claimed in claim 11, wherein the guiding member is offset from the rotation axis.

20. The semiconductor wafer cleaning apparatus as claimed in claim 11, further comprising a catch cup, wherein the spin base is disposed in the catch cup.

* * * * *